United States Patent
Yen et al.

(10) Patent No.: US 8,884,670 B2
(45) Date of Patent: Nov. 11, 2014

(54) PHASE LOCKED LOOP (PLL) WITH MULTI-PHASE TIME-TO-DIGITAL CONVERTER (TDC)

(71) Applicant: Taiwan Semiconductor Manufacturing Company Limited, Hsin-Chu (TW)

(72) Inventors: Kuang-Kai Yen, Kaohsiung (TW); Feng Wei Kuo, Zhudong Township (TW); Huan-Neng Chen, Taichung (TW); Lee Tsung Hsiung, New Taipei (TW); Hsien-Yuan Liao, Huatan Township (TW); Robert Bogdan Staszewski, Delft (NL); Chewn-Pu Jou, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/088,677

(22) Filed: Nov. 25, 2013

(65) Prior Publication Data
US 2014/0210528 A1    Jul. 31, 2014

Related U.S. Application Data

(63) Continuation of application No. 13/755,159, filed on Jan. 31, 2013, now Pat. No. 8,593,189.

(51) Int. Cl.
*H03L 7/06* (2006.01)
*H03L 7/08* (2006.01)
*H03M 1/50* (2006.01)

(52) U.S. Cl.
CPC .. *H03M 1/50* (2013.01); *H03L 7/08* (2013.01)

USPC .......................................... 327/156; 327/147

(58) Field of Classification Search
USPC ................................. 327/147, 156
See application file for complete search history.

(56) References Cited

U.S. PATENT DOCUMENTS

| | | | |
|---|---|---|---|
| 2009/0231050 A1* | 9/2009 | Lin ............................... | 331/1 A |
| 2010/0264993 A1* | 10/2010 | Wang et al. ................... | 331/1 A |
| 2010/0277244 A1* | 11/2010 | Chang et al. .................... | 331/16 |
| 2010/0283654 A1* | 11/2010 | Waheed et al. ............... | 341/166 |
| 2010/0323643 A1* | 12/2010 | Ridgers ......................... | 455/118 |
| 2011/0099450 A1* | 4/2011 | Chang et al. .................. | 714/752 |
| 2013/0009681 A1* | 1/2013 | Endo et al. .................... | 327/156 |
| 2013/0043920 A1* | 2/2013 | Lee et al. ....................... | 327/159 |
| 2013/0113528 A1* | 5/2013 | Frantzeskakis et al. ...... | 327/117 |
| 2013/0147529 A1* | 6/2013 | Ganesan et al. .............. | 327/156 |
| 2013/0162355 A1* | 6/2013 | Mendel .......................... | 331/16 |

* cited by examiner

*Primary Examiner* — Adam Houston
(74) *Attorney, Agent, or Firm* — Cooper Legal Group

(57) ABSTRACT

One or more techniques or systems for locking a phase locked loop (PLL) are provided herein. In some embodiments, a multi-phase time-to-digital converter (TDC) includes a first phase finder, a phase predictor, a second phase finder, and a phase switch. For example, the first phase finder is configured to generate a first fractional phase signal based on a multi-phase variable clock (CKV) signal. For example, the phase predictor is configured to generate a phase select (QSEL) signal or a multi-phase CKV select (CKVSEL) signal based on a frequency command word (FCW) signal or the multi-phase CKV signal. For example, the second phase finder is configured to generate a second fractional phase signal based on the CKVSEL signal or the QSEL signal. For example, the phase switch is configured to select the first or second fractional phase signal based on a phase error (PHE) signal.

20 Claims, 9 Drawing Sheets

US 8,884,670 B2

PHASE LOCKED LOOP (PLL) WITH MULTI-PHASE TIME-TO-DIGITAL CONVERTER (TDC)

RELATED APPLICATION

This application is a continuation of U.S. Non-Provisional patent application Ser. No. 13/755,159, filed on Jan. 31, 2013 and entitled "PHASE LOCKED LOOP (PLL) WITH MULTI-PHASE TIME-TO-DIGITAL CONVERTER (TDC)," which is incorporated herein.

BACKGROUND

Generally, a phase locked loop (PLL) generates an output signal associated with a phase related to a phase of an input signal. Some PLLs use a counter to report an integer phase of a digitally controlled oscillator (DCO). Additionally, some PLLs use a time-to-digital converter (TDC) to report a fractional phase of the DCO. However, managing power consumption and area associated with a PLL or a TDC becomes challenging with more advanced technology.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for locking a phase locked loop (PLL) are provided herein. In some embodiments, a PLL comprises a multi-phase time-to-digital converter (TDC). In some embodiments, the multi-phase TDC is configured to generate a first fractional phase signal of a multi-phase variable clock (CKV) signal based on at least one of the multi-phase CKV signal or a reference frequency (FREF) signal. In some embodiments, the multi-phase CKV signal is associated with one or more clock signals and one or more corresponding phases. As an example, some CKV signals are four-phase CKV signals. In this example, a four-phase CKV signal comprises a first signal associated with a first phase, a second signal associated with a second phase, a third signal associated with a third phase, and a fourth signal associated with a fourth phase. In some embodiments, the multi-phase TDC is configured to generate a second fractional phase signal of the multi-phase CKV signal based on at least one of the multi-phase CKV signal, a frequency command word (FCW) signal, or a phase reference (PHR) signal. In some embodiments, the phase switch is configured to select at least one of the first fractional phase signal or the second fractional phase signal based on a phase error (PHE) signal. In this way, the PLL comprising the multi-phase TDC is configured for reduced power consumption, at least because the first phase finder is off when the second phase finder and the phase predictor are on. Additionally, the second phase finder and the phase predictor are off when the first phase finder is on. Accordingly, power consumption is reduced for the PLL or multi-phase TDC, at least because the first phase finder toggles on or off based on the second phase finder and the phase predictor. It will be appreciated that a number of inverters associated with the multi-phase TDC is reduced, at least because the second phase finder is configured to cover a portion of a clock generated by a digitally controlled oscillator (DCO), such as a portion of the CKV. Accordingly, it will be appreciated that power consumption or area associated with the multi-phase TDC is mitigated in this way, at least because the number of inverters associated with the multi-phase TDC is reduced.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion.

DETAILED DESCRIPTION

Figure 1:
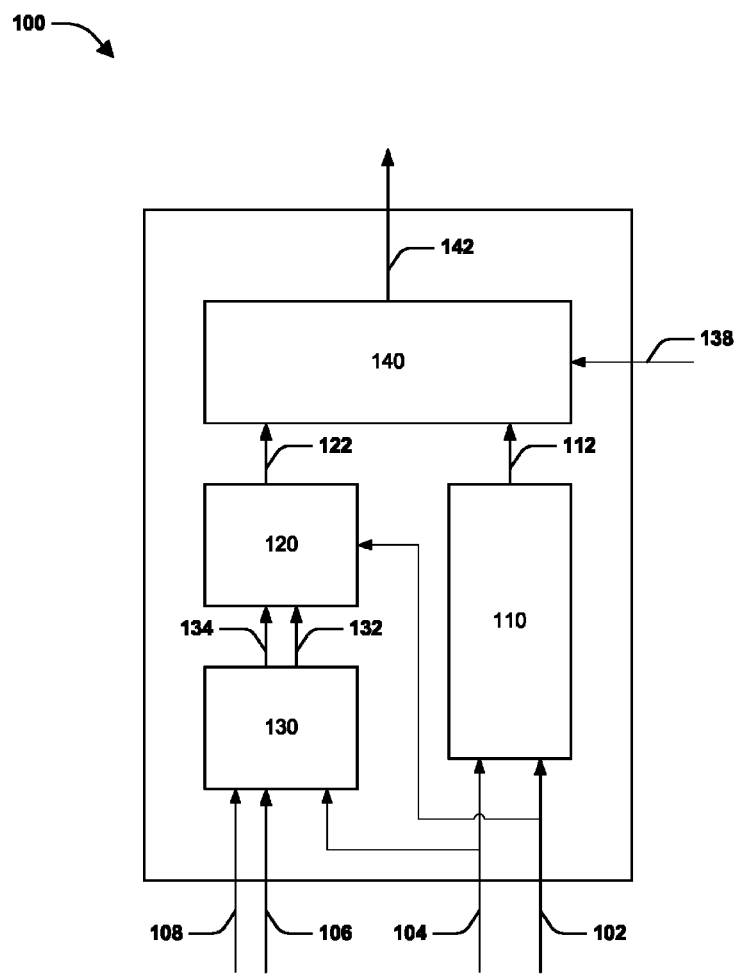
FIG. 1 is a schematic diagram of an example multi-phase time-to-digital converter (TDC), according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

FIG. 1 is a schematic diagram of an example multi-phase time-to-digital converter (TDC) 100, according to some embodiments. In some embodiments, the multi-phase TDC 100 comprises a first phase finder 110, a phase predictor 130, a second phase finder 120, and a phase switch 140. In some embodiments, the first phase finder 110 comprises a first input, a second input, and an output. For example, the first input of the first phase finder 110 is connected to a reference frequency (FREF) line 102 associated with a FREF signal. For example, the second input of the first phase finder 110 is connected to a multi-phase variable clock (CKV) line 104 associated with a multi-phase CKV signal. In some embodiments, the first phase finder 110 is configured to generate a first fractional phase signal at the output of the first phase finder 110. In some embodiments, the output of the first phase finder 110 is connected to a first fractional phase line 112. In some embodiments, the output of the first phase finder 110 is connected to a first input of the phase switch 140 via the first fractional phase line 112.

It will be appreciated that the multi-phase TDC 100 is configured according to a multi-phase CKV. In some embodiments, the multi-phase CKV is a four-phase CKV. However, it will be appreciated that at least one of the multi-phase TDC 100 or the multi-phase CKV is associated with a number of phases other than four in some embodiments.

In some embodiments, the first phase finder 110 is configured to generate the first fractional phase signal of the multi-phase CKV signal based on at least one of the multi-phase CKV signal or the FREF signal. It will be appreciated that the multi-phase CKV signal is associated with one or more clock signals and one or more corresponding phases. In some embodiments, the first phase finder 110 is configured to generate a first fractional phase signal of a four-phase variable clock (CKV) signal based on at least one of the four-phase CKV signal or a reference frequency (FREF) signal. For example, a four-phase CKV signal comprises a first clock signal associated with a first corresponding phase, a second clock signal associated with a second corresponding phase, a third clock signal associated with a third corresponding phase, and a fourth clock signal associated with a fourth corresponding phase. In some embodiments, the first clock signal, the second clock signal, the third clock signal, and the fourth clock signal are associated with substantially similar frequencies. In some embodiments, respective phases are defined by increments of three hundred and sixty degrees divided by a number of phases. For example, for the four-phase CKV signal, the first phase is associated with at least about zero degrees, the second phase is associated with at least about ninety degrees, the third phase is associated with at least about one hundred and eighty degrees, and the fourth phase is associated with at least about two hundred and seventy degrees. In this way, the first phase finder 110 is configured to select a clock signal and corresponding phase from at least one of the one or more clock signals. For example, the first phase finder 110 is configured to select the clock signal associated with a phase closest to a phase of the FREF signal. As an example, if the FREF signal is associated with a phase of ten degrees and the CKV is a four-phase CKV, the first phase finder 110 is configured to select the first clock signal associated with the first phase of at least about zero degrees. In this way, the first phase finder 110 is configured to generate the first fractional phase signal in a quick fashion, at least because the first fractional phase signal is generated based on a number of phases associated with the multi-phase CKV signal.

In some embodiments, the phase predictor 130 comprises a first input, a second input, a third input, a first output, and a second output. For example, the first input of the phase predictor 130 is connected to the multi-phase variable clock (CKV) line 104 associated with the multi-phase CKV signal. For example, the second input of the phase predictor 130 is connected to a phase reference (PHR) line 106 associated with a PHR signal. In some embodiments, the PHR signal is a reference phase associated with the FREF signal. For example, the third input of the phase predictor 130 is connected to a frequency command word (FCW) line 108 associated with a FCW signal. In some embodiments, the phase predictor 130 is configured to generate a phase select (QSEL) signal at the first output of the phase predictor 130. In some embodiments, the first output of the phase predictor 130 is connected to a QSEL line 132. In some embodiments, the first output of the phase predictor 130 is connected to a first input of the second phase finder 120 via the QSEL line 132. In some embodiments, the phase predictor 130 is configured to generate a multi-phase CKV select (CKVSEL) signal at the second output of the phase predictor 130. In some embodiments, the second output of the phase predictor 130 is connected to a CKVSEL line 134. In some embodiments, the second output of the phase predictor 130 is connected to a second input of the second phase finder 120 via the CKVSEL line 134.

In some embodiments, the phase predictor 130 is configured to generate at least one of the CKVSEL signal or the QSEL signal based on at least one of the multi-phase CKV signal, the PHR signal, or the FCW signal. In some embodiments, the QSEL signal is generated based on at least one of the PHR signal or the FCW signal. In some embodiments, the CKVSEL signal is generated based on at least one of the QSEL signal or the multi-phase CKV signal. In some embodiments, the QSEL signal is associated with a mapping of a fractional portion of the FCW signal. It will be appreciated that the multi-phase CKV signal is associated with one or more clock signals and one or more corresponding phases. In some embodiments, the CKVSEL signal is generated based on a selection of at least one of the one or more clock signals and corresponding phases. In this way, the phase predictor 130 is configured to provide the second phase finder 120 with at least one of a clock signal or an associated offset, thereby facilitating phase locking for the second phase finder 120. In other words, the CKVSEL signal is configured to mitigate processing time or power consumption associated with the second phase finder 120, at least because the CKVSEL signal is a clock signal associated with a phase offset. Additionally, it will be appreciated that the QSEL signal is indicative of the phase offset according to some embodiments. In this way, at least one of the CKVSEL signal or the QSEL signal generated by the phase predictor 130 enables quicker processing or reduced power consumption. For example, if a PHR signal is associated with a fractional part from at least about 0.75 to at least about 1.00, the phase predictor 130 is configured to select a fourth clock signal associated with a two hundred and seventy degree phase from the one or more multi-phase CKV signals to be the CKVSEL signal. Additionally, the FCW signal is used to generate the QSEL signal and predict a next CKV fractional phase.

In some embodiments, the second phase finder 120 comprises a first input, a second input, a third input, and an output. For example, the first input of the second phase finder 120 is connected to the QSEL line 132 associated with the QSEL signal. For example, the second input of the second phase finder 120 is connected to the CKVSEL line 134 associated with the CKVSEL signal. For example, the third input of the second phase finder 120 is connected to the FREF line 102 associated with the FREF signal. In some embodiments, the second phase finder 120 is configured to generate a second fractional phase signal at the output of the second phase finder 120. In some embodiments, the output of the second phase finder 120 is connected to a second fractional phase line 122. In some embodiments, the output of the second phase finder 120 is connected to a second input of the phase switch 140 via the second fractional phase line 122.

In some embodiments, the second phase finder 120 is configured to generate the second fractional phase signal based on at least one of the FREF signal, the CKVSEL signal, or the QSEL signal. For example, the second phase finder 120 is configured to determine a phase distance between the CKVSEL signal and the FREF signal. In some embodiments, the phase distance is a phase difference expressed in units of time. In some embodiments, the second phase finder 120 is configured for multi-phase CKV operation, at least because the second phase finder 120 comprises a number of inverters associated with a digitally controlled oscillator (DCO) clock period divided by a number of phases associated with the CKV clock period of the DCO. For example, if a CKV clock period is eighty nanoseconds long, the CKV is a four-phase CKV, and an inverter is associated with a ten nanosecond delay, the second phase finder 120 comprises at least about two inverters, at least because two inverters covers at least about twenty nanoseconds. In other words, the second phase finder 120 is configured to cover a quarter of the CKV clock period when the CKV is a four-phase CKV. Explained another way, the second phase finder 120 is configured to cover at least about one fourth of a DCO period based on a four-phase CKV signal. In this way, area and power consumption associated with additional inverters is mitigated, at least because six inverters are not required to cover the other three quarters of the CKV clock period. Accordingly, the second phase finder 120 is thus not required to cover the CKV clock period. In some embodiments, the second phase finder 120 comprises a number of inverters associated with the clock period divided by the number of phases associated with the CKV. In this way, the number of inverters associated with the second phase finder 120 is mitigated, thereby mitigating power consumption.

In some embodiments, a unit of time associated with the phase difference is based on an inverter delay. For example, if the CKVSEL signal is twenty nanoseconds from the FREF signal, and an inverter is associated with a ten nanosecond delay, the second phase finder 120 is configured to determine that there is a two inverter difference between the CKVSEL signal and the FREF signal. In some embodiments, the second phase finder 120 is configured to convert the phase difference expressed in units of time into a phase difference expressed in degrees. Additionally, the second phase finder 120 is configured to convert the QSEL signal into an offset expressed in degrees. Accordingly, the second phase finder 120 is configured to generate a second fractional phase signal indicative of a phase difference between a first clock of the multi-phase CKV signal and the FREF signal. In this way, no high speed multiplexing or time amplifiers are required, at least because the multi-phase TDC 100 is configured to switch between the first phase finder 110 and the second phase finder 120.

In some embodiments, the phase switch 140 comprises a first input, a second input, a third input, and an output. For example, the first input of the phase switch 140 is connected to the first fractional phase line 112 associated with the first fractional phase signal. For example, the second input of the phase switch 140 is connected to the second fractional phase line 122 associated with the second fractional phase signal. For example, the third input of the phase switch 140 is connected to a phase error (PHE) line 138 associated with a PHE signal. In some embodiments, the phase switch 140 is configured to generate a fractional variable phase correction (PHVF) signal at the output of the phase switch 140. In some embodiments, the output of the phase switch 140 is connected to a PHVF line 142. In some embodiments, the phase switch 140 is configured to select the first fractional phase signal when the PHE is at least one of greater than or equal to at least about ninety degrees. In some embodiments, the phase switch 140 is configured to select the second fractional phase signal when the PHE is less than at least about ninety degrees. In some embodiments, the first phase finder 110 is turned off when at least one of the second phase finder 120 or the phase predictor 130 is on. In some embodiments, at least one of the second phase finder 120 or the phase predictor 130 is turned off when the first phase finder 110 is on. In this way, power consumption associated with at the multi-phase TDC 100 is mitigated. In some embodiments, the phase switch 140 is configured to disable the second phase finder 120 when the first phase finder 110 is enabled. In some embodiments, the phase switch 140 is configured to enable the second phase finder 120 when the first phase finder 110 is disabled.

Figure 2:
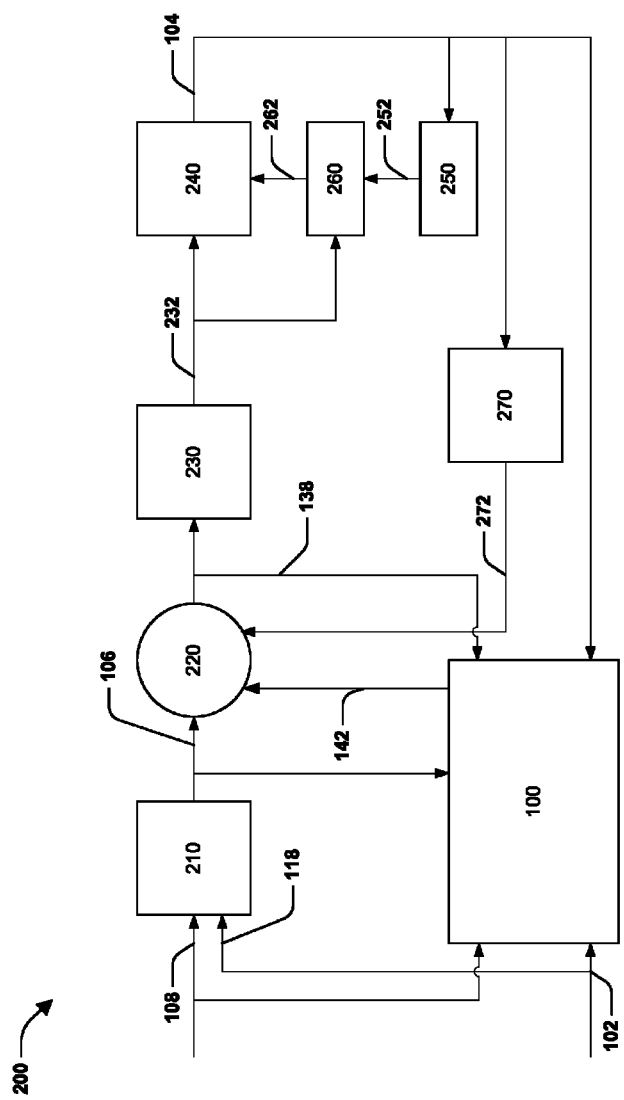
FIG. 2 is a schematic diagram of an example phase locked loop (PLL) associated with a multi-phase time-to-digital converter (TDC), according to some embodiments.

FIG. 2 is a schematic diagram of an example phase locked loop (PLL) 200 associated with a multi-phase time-to-digital converter (TDC), according to some embodiments. In some embodiments, the PLL 200 of FIG. 2 is an all digital phase locked loop (ADPLL). In some embodiments, the PLL 200 comprises a accumulator component 210, an adder component 220, a loop filter 230, a digitally controlled oscillator (DCO) 240, a sigma delta modulation component 260, a frequency divider 250, a counter component 270, and a multi-phase time-to-digital converter (TDC) 100.

In some embodiments, the accumulator component 210 comprises an input and an output. For example, the input of the accumulator component 210 is connected to a frequency command word (FCW) line 108 associated with a FCW signal. Additionally, the accumulator component 210 comprises a second input connected to the FREF line 102. For example, the output of the accumulator component 210 is connected to a phase reference (PHR) line 106 associated with a PHR signal. In some embodiments, the accumulator component 210 is connected to an input of at least one of the adder component 220 or the multi-phase TDC 100. In some embodiments, the accumulator component 210 is configured to generate the PHR signal based on at least one of the FCW signal or the FREF signal.

In some embodiments, the adder component 220 comprises an input, a second input, a third input, and an output. For example, the input of the adder component 220 is connected to the PHR line 106 associated with the PHR signal. For example, the second input of the adder component 220 is connected to a fractional variable phase correction (PHVF) line 142 associated with a PHVF signal. For example, the third input of the adder component 220 is connected to an integer variable phase correction (PHVI) line 272 associated with a PHVI signal. For example, the output of the adder component 220 is connected to a phase error (PHE) line 138 associated with a PHE signal. In some embodiments, the adder component 220 is connected to an input of at least one of the loop filter 230 or the multi-phase TDC 100.

In some embodiments, the adder component 220 is configured to generate the PHE signal based on at least one of the PHR signal, the PHVI signal, or the PHVF signal. In some embodiments, the adder component 220 is configured to determine a phase difference between the PHR signal and the multi-phase CKV signal generated by the DCO 240, at least because at least one of the multi-phase TDC 100 or the counter component 270 generates at least one of the PHVF or PHVI signal based on the multi-phase CKV signal. In this way, the adder component facilitates a lock for the PLL 200.

In some embodiments, the loop filter 230 comprises an input and an output. For example, the input of the loop filter 230 is connected to the PHE line 138 associated with the PHE signal. For example, the output of the loop filter 230 is connected to an input of at least one of the DCO 240 or the sigma delta modulation component 260 via 232. In some embodiments, the loop filter 230 is configured to filter at least some of the PHE signal and generate an output at 232.

In some embodiments, the DCO 240 comprises an input, a second input, and an output. For example, the input of the DCO 240 is connected to the loop filter 230 via 232. For example, the second input of the DCO 240 is connected to the sigma delta modulation component 260 via 262. For example, the output of the DCO 240 is connected to a multi-phase variable clock (CKV) line 104 associated with a multi-phase CKV signal. In some embodiments, the DCO 240 is connected to an input of at least one of the multi-phase TDC 100, a first phase finder 110, a phase predictor 130, the counter component 270, or the frequency divider 250. In some embodiments, the DCO 240 is configured to generate the multi-phase CKV signal based on at least one of an output from the loop filter 230 or an output from the sigma delta modulation component 260. In some embodiments, the DCO 240 is configured to generate the multi-phase CKV signal associated with one or more clock signals and one or more corresponding phases. For example, for a four-phase CKV, the DCO 240 is configured to generate a first clock signal associated with a zero degree phase, a second clock signal associated with at least about a ninety degree phase, a third clock signal associated with at least about a one hundred and eighty degree phase, and a fourth clock signal associated with at least about a two hundred and seventy degree phase. It will be appreciated that at least one of the first clock signal, the second clock signal, the third clock signal, or the fourth clock signal is associated with a same frequency as at least one of the other clock signals in some embodiments. Additionally, a degree increment associated with a phase of a clock signal is equal to at least about three hundred and sixty divided by a number of phases associated with the multi-phase CKV signal.

In some embodiments, the frequency divider 250 comprises an input and an output. For example, the input of the frequency divider 250 is connected to the CKV line 104 associated with the multi-phase CKV signal. For example, the output of the frequency divider 250 is connected to a second input of the sigma delta modulation component 260. In some embodiments, the frequency divider 250 is configured to divide the multi-phase CKV signal by fixed number. For example, the fixed number is selected to be a number of phases associated with the multi-phase CKV signal. If the multi-phase CKV signal is a four-phase CKV signal, the frequency divider 250 is configured to divide the multi-phase CKV signal by four. That is, if the input of the frequency divider 250 is eight gigahertz, the output of the frequency divider is two gigahertz.

In some embodiments, the sigma delta modulation component 260 comprises an input, a second input, and an output. For example, the input of the sigma delta modulation component 260 is connected to the loop filter 230 via 232. For example, the second input of the sigma delta modulation component 260 is connected to the frequency divider 250 via 252. For example, the output of the sigma delta modulation component 260 is connected to a second input of the DCO 240 via 262.

In some embodiments, the counter component 270 comprises an input and an output. For example, the input of the counter component 270 is connected to the CKV line 104 associated with the multi-phase CKV signal. For example, the output of the counter component 270 is connected to at least one of an integer variable phase correction (PHVI) line 272 associated with a PHVI signal or a third input of the adder component 220. In some embodiments, the counter 270 is configured to at least one of generate or report an integer phase of the DCO 240, such as the PHVI signal, based on the CKV generated by the DCO 240. In some embodiments, the counter component 270 is configured to lock the DCO 240 to a same frequency as the FREF signal based on the multi-phase CKV signal.

In some embodiments, the multi-phase TDC 100 comprises one or more inputs and an output. For example, an input of the one or more inputs of the multi-phase TDC 100 is connected to at least one of the FCW line 108 associated with the FCW signal, the PHR line 106 associated with the PHR signal, the PHE line 138 associated with the PHE signal, the FREF line 102 associated with the FREF signal, or the multi-phase CKV line 104 associated with the multi-phase CKV signal. For example, the output of the multi-phase TDC 100 is connected to the PHVF line 142 associated with the PHVF signal. In some embodiments, the multi-phase TDC 100 is connected to a second input of the adder component 220. In some embodiments, the multi-phase TDC 100 is configured to at least one of generate or report a fractional phase of the DCO 240, such as the PHVF signal, based on the CKV generated by the DCO 240. In some embodiments, the multi-phase TDC 100 is configured to lock the CKV generated by the DCO 240 to a same phase as at least one of the FREF signal or the PHR signal based on the multi-phase CKV signal. In some embodiments, an output of a phase switch 140 is connected to an input of the adder component 220 via a PHVF line 142 associated with a PHVF signal.

Figure 3:
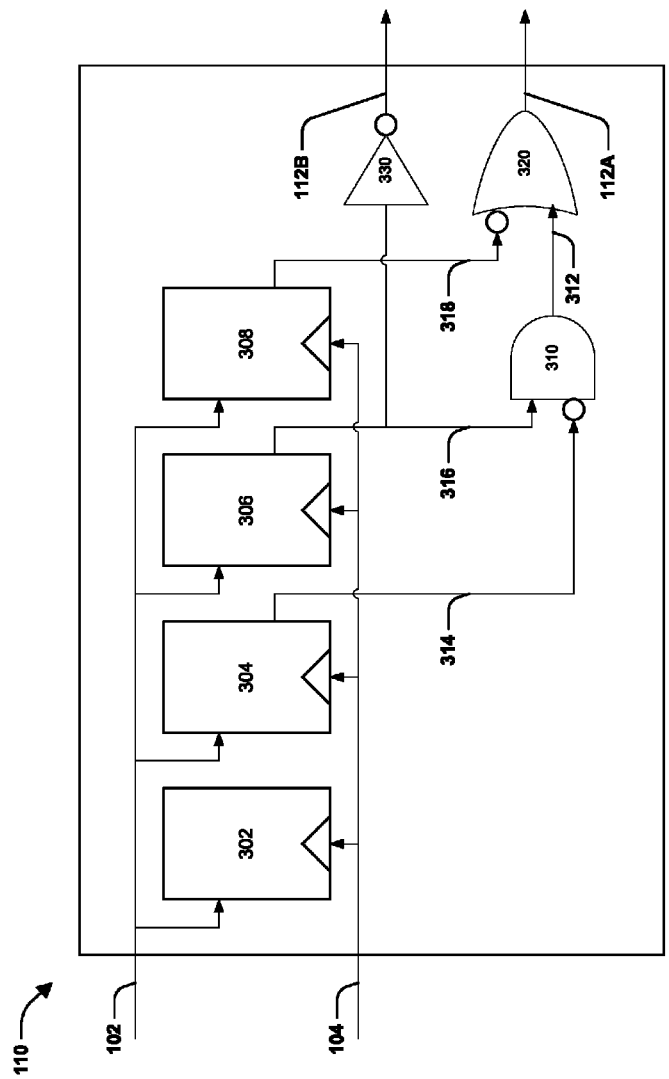
FIG. 3 is a schematic diagram of an example first phase finder, according to some embodiments.

FIG. 3 is a schematic diagram of an example first phase finder 110, according to some embodiments. In some embodiments, the first phase finder 110 comprises a first flip flop (FF) 302, a second FF 304, a third FF 306, a fourth FF 308, an AND gate 310, an OR gate 320, and an inverter 330. In some embodiments, the first phase finder 110 is configured to generate a binary code associated with at least one of a first clock, a second clock, a third clock, or a fourth clock. In some embodiments, the first phase finder 110 of FIG. 3 is configured to generate a first fractional phase signal for a four-phase CKV. In some embodiments, the first phase finder 110 of FIG. 3 is configured to operate when the PHE is greater than or equal to at least about ninety degrees. In some embodiments, the first FF 302 is connected to a FREF line 102 and a multi-phase CKV line 104. Similarly, at least one of the second FF 304, the third FF 306, or the fourth FF 308 is connected to the FREF line 102 and the multi-phase CKV line 104. In some embodiments, the AND gate 310 comprises a first input, a second inverted input, and an output. For example, the first input of the AND gate 310 is connected to an output of the third FF 316. In some embodiments, the second inverted input of the AND gate 310 is connected to an output of the second FF 314. In some embodiments, the OR gate 320 comprises a first inverted input, a second input, and an output. For example, the first inverted input of the OR gate 320 is connected to an output of the fourth FF 318. For example, the second input of the OR gate 320 is connected to the output of the AND gate 312. In some embodiments, the inverter 330 comprises an input and an output. For example, the input of the inverter 330 is connected to the output of the third FF 316. For example, the output of the inverter 330 is associated with a second bit for the first fractional phase signal. For example, the output of the OR gate 320 is associated with a first bit for the first fractional phase signal. In some embodiments, the first fractional phase signal comprises the first bit and the second bit. In some embodiments, the output of the inverter 330 is connected to a second bit line 112B and the output of the OR gate 320 connected to a first bit line 112A.

Figure 4:
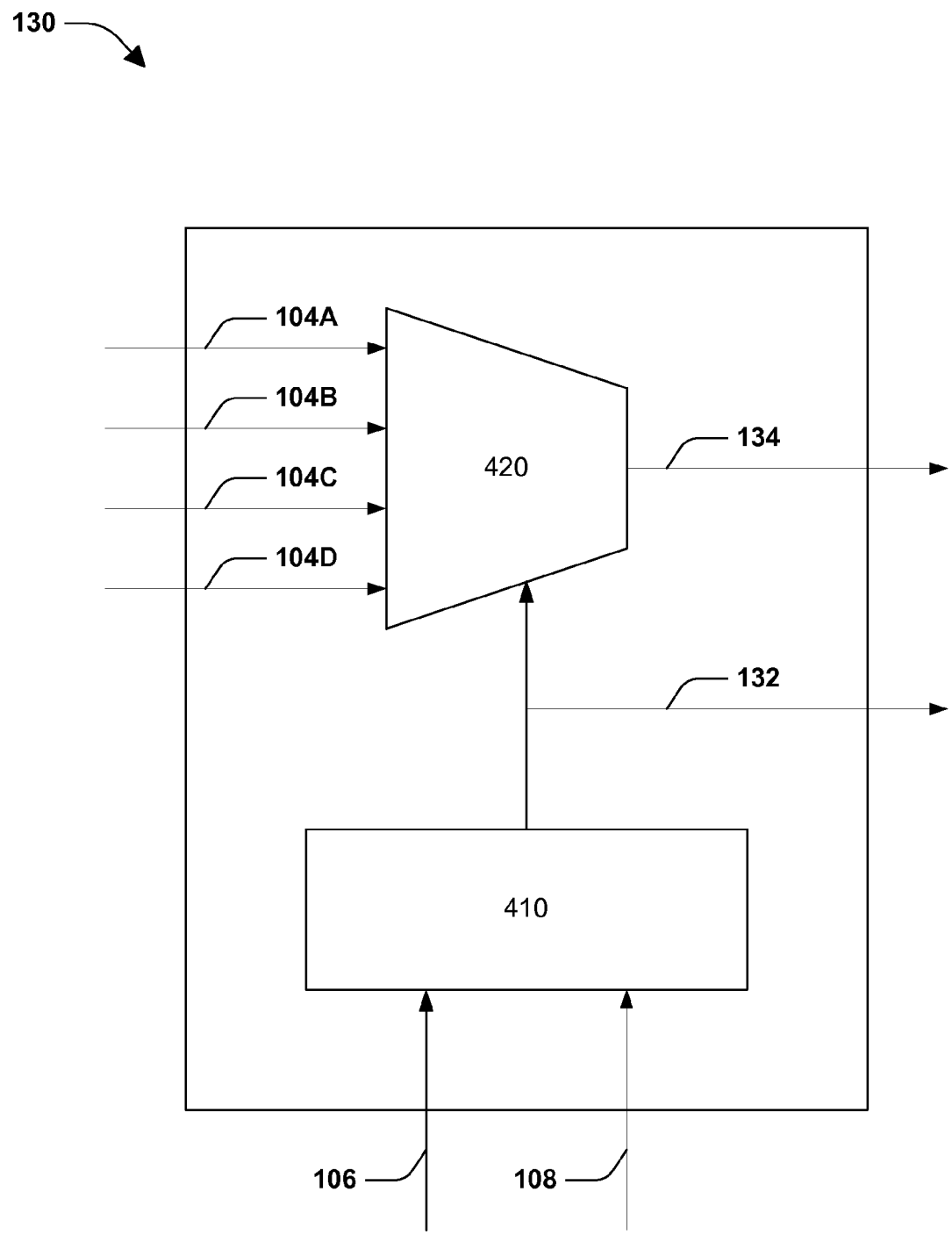
FIG. 4 is a schematic diagram of an example phase predictor, according to some embodiments.

FIG. 4 is a schematic diagram of an example phase predictor 130, according to some embodiments. In some embodiments, the phase predictor 130 comprises a phase forward component 410 and a multiplexer (MUX) 420. In some embodiments, the phase forward component 410 is configured to generate a QSEL signal based on at least one of a FCW signal or a PHR signal. In some embodiments, the phase forward component 410 is connected to at least one of an FCW line 108 associated with the FCW signal or a PHR line 106 associated with the PHR signal. In some embodiments, the MUX 420 is configured to generate a CKVSEL signal by selecting at least one of one or more clock signals associated with CKV and corresponding phases based on the QSEL signal. In some embodiments, an output of the phase forward component is connected to at least one of a QSEL line 133 or the MUX 420. In some embodiments, the phase predictor 130 of FIG. 4 is configured to generate the CKVSEL signal based on a four-phase CKV. In some embodiments, the MUX 420 is connected to one or more multi-phase CKV lines 104A, 104B, 104C, or 104D. In some embodiments, the multi-phase CKV line is associated with at least one of the one or more CKV lines 104A, 104B, 104C, or 104D. In some embodiments, an output of the MUX 420 is connected to a CKVSEL line 134. In this way, the MUX 420 is configured to generate the CKVSEL signal.

Figure 5:
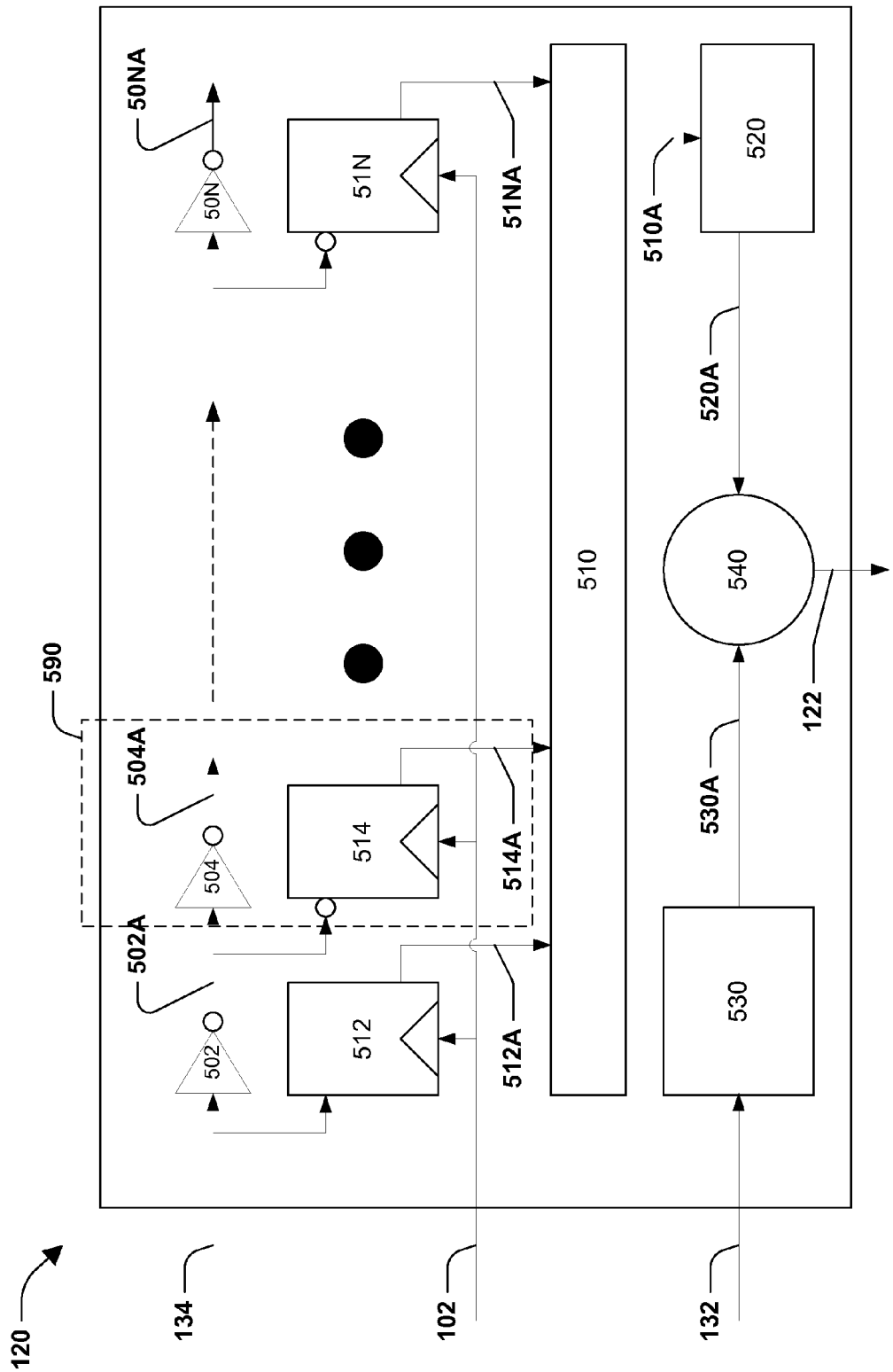
FIG. 5 is a schematic diagram of an example second phase finder, according to some embodiments.

FIG. 5 is a schematic diagram of an example second phase finder 120, according to some embodiments. In some embodiments, the second phase finder 120 comprises one or more delay units, a thermometer decoder 510, a time phase converter 520, a shift register 530, and an adder component 540. In some embodiments, a delay unit 590 of the one or more delay units comprises a first inverter 504 and a first flip flop (FF) 514. In some embodiments, an inverter comprises an input and an output. For example, the input of the inverter is connected to at least one of a CKVSEL line 134 or an output of a second inverter 502A of a second time delay unit. In some embodiments, a FF comprises an output. For example, a FF is connected to at least one of the CKVSEL line 134, the output of the second inverter 502A, or a FREF line 102. In some embodiments, the second phase finder 120 comprises N number of delay units, where the Nth delay unit comprises an Nth inverter 50N and an Nth FF 51N. In some embodiments, the thermometer decoder 510 is connected to one or more output of respective FFs. For example, the thermometer decoder 510 is connected to an output of the first FF 512A, an output of the second FF 514A, etc. In some embodiments, the time phase converter 520 is connected to the thermometer decoder 510. In some embodiments, the shift register 530 is connected to a QSEL line 132. In some embodiments, the adder component 540 is connected to the timer phase converter 520 and the shift register 530. In some embodiments, the thermometer decoder 510 is configured to determine a time difference between the FREF signal and the CKVSEL signal. Generally, an inverter is associated with a delay time such that an output is produced for the inverter the delay time after the input is provided. The time difference between the FREF signal and the CKVSEL signal is expressed as a number of units, such as a number of inverters strung together in series in order for the string of inverters to approximate the time difference between the FREF signal and the CKVSEL signal. In some embodiments, the time phase converter 520 is configured to determine a degree phase difference between the FREF signal and the CKVSEL signal based on an output of the thermometer decoder 510A. In some embodiments, the adder component 540 is configured to determine a degree phase difference between the FREF signal and the multi-phase CKV signal. For example, the output of the shift register 530A is associated with an offset between CKVSEL and a first CKV clock signal. Additionally, the output of the time phase converter 520 is associated with a phase difference between the CKVSEL signal and the FREF signal. Accordingly, the adder component 540 is configured to determine a second fractional phase signal based on 530A and 520A.

Figure 6:
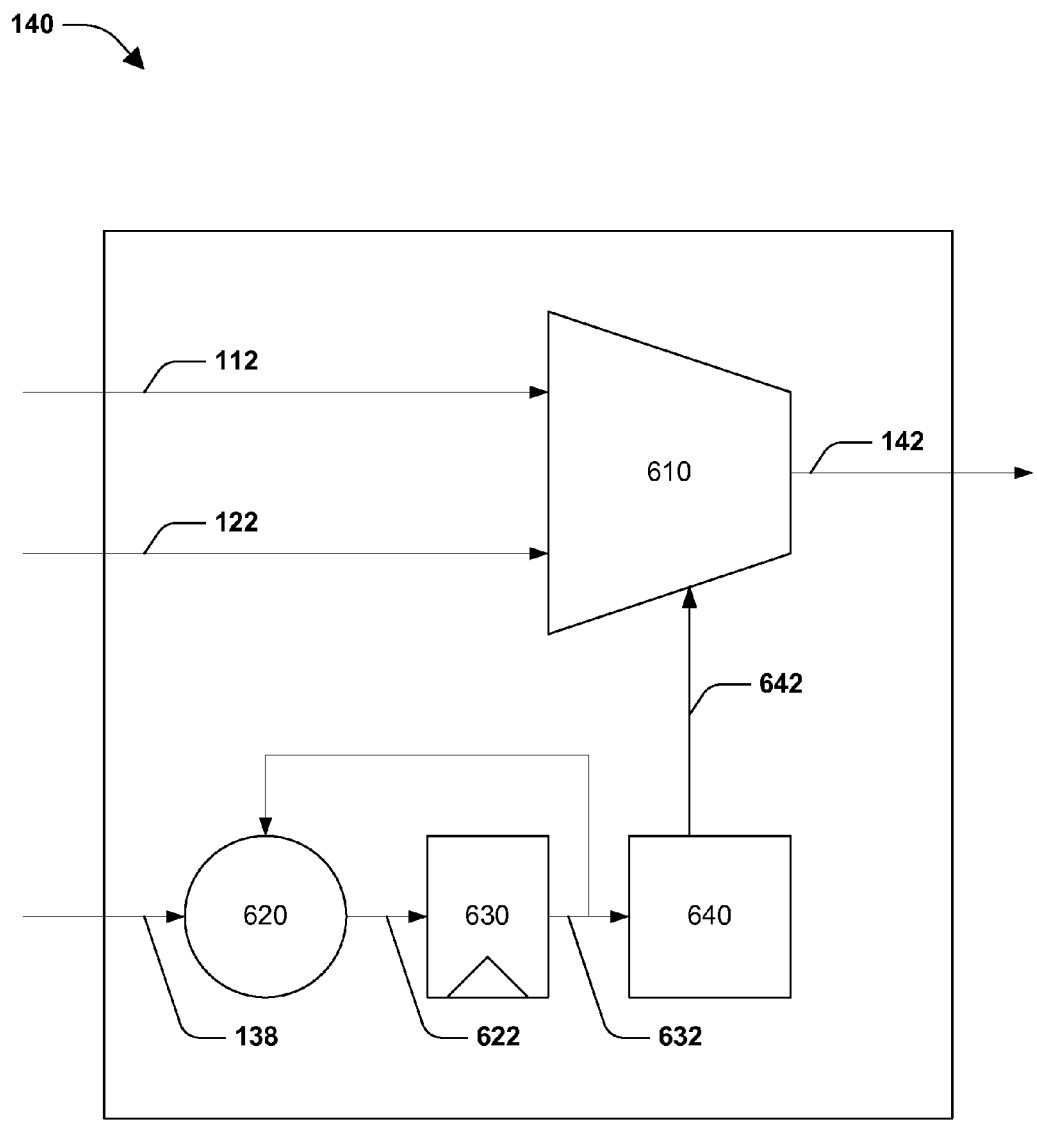
FIG. 6 is a schematic diagram of an example phase switch, according to some embodiments.

FIG. 6 is a schematic diagram of an example phase switch 140, according to some embodiments. In some embodiments, the phase switch 140 comprises an adder component 620, a flip flop (FF) 630, a comparator 640, and a multiplexer (MUX) 610. In some embodiments, the adder component 620 is connected to a PHE line 138 associated with a PHE signal. In some embodiments, the FF 630 is connected to an output of the adder component 622. In some embodiments, an output of the FF 632 is connected to the adder component 620. In some embodiments, the comparator 640 is connected to the output of the FF 632. In some embodiments, the MUX 610 is connected to an output of the comparator 642. In some embodiments, the MUX 610 is connected to at least one of a first fractional phase line 112 or a second fractional phase line 122. In some embodiments, the MUX 610 is configured to select at least one of a first fractional phase signal or a second fractional phase signal based on the output of the comparator 642.

Figure 7:
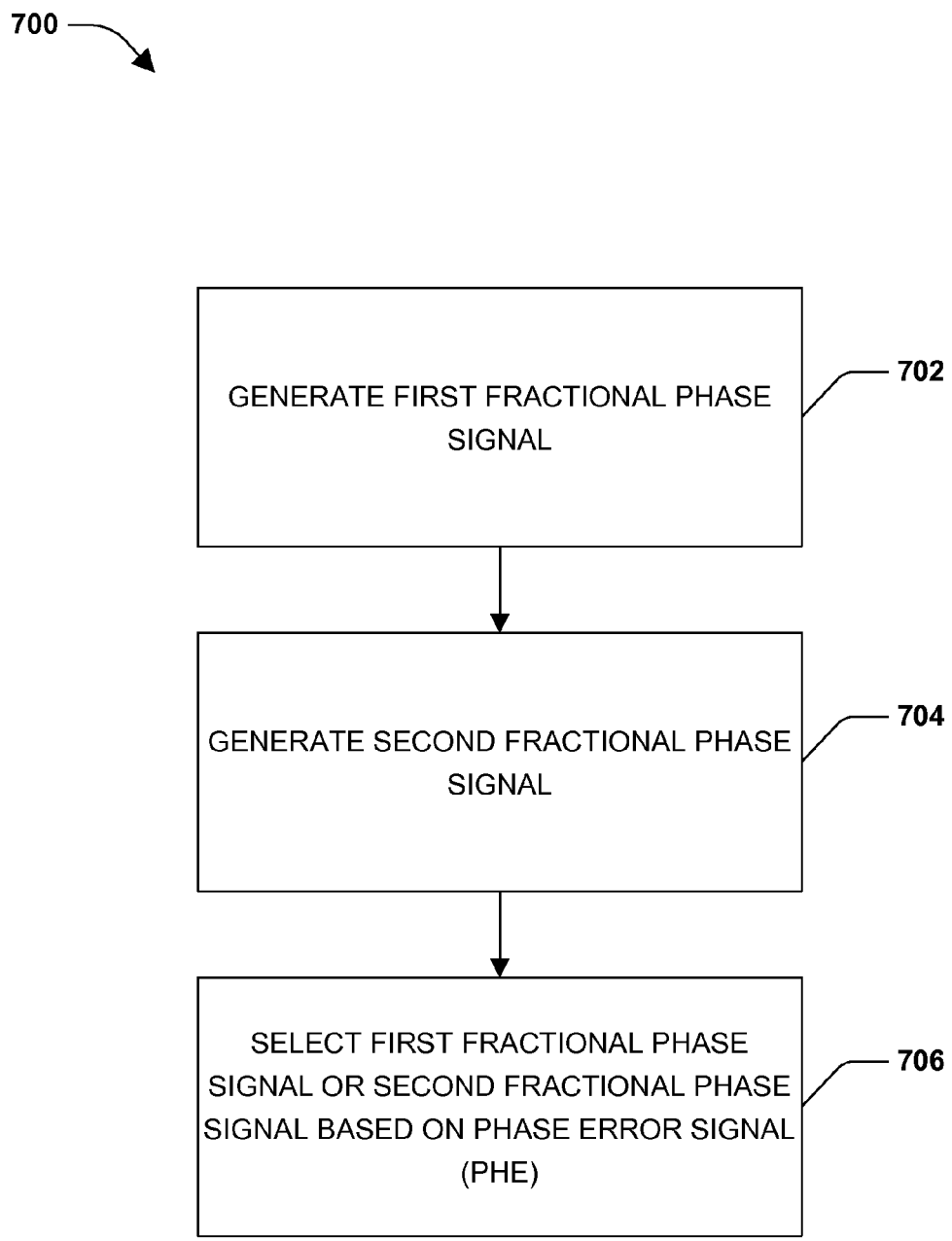
FIG. 7 is a flow diagram of an example method for locking a phase locked loop (PLL), according to some embodiments.

FIG. 7 is a flow diagram of an example method 700 for locking a phase locked loop (PLL), according to some embodiments. In some embodiments, the method 700 comprises generating a first fractional phase signal of a multi-phase variable clock (CKV) signal based on at least one of the multi-phase CKV signal or a reference frequency (FREF) signal at 702. For example, the multi-phase CKV signal associated with one or more clock signals and one or more corresponding phases. In some embodiments, the method 700 comprises generating a second fractional phase signal of the multi-phase CKV signal based on at least one of the multi-phase CKV signal, a frequency command word (FCW) signal, or a phase reference (PHR) signal at 704. In some embodiments, the method 700 comprises selecting at least one of the first fractional phase signal or the second fractional phase signal based on a phase error (PHE) signal at 706.

Figure 8:
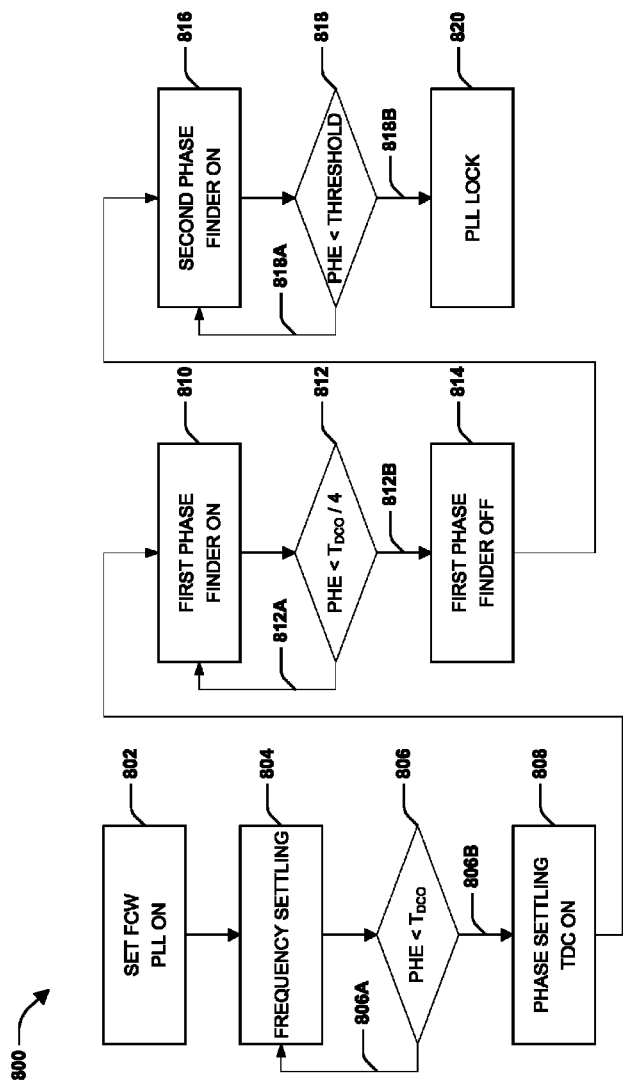
FIG. 8 is a flow diagram of an example method for locking a phase locked loop (PLL), according to some embodiments.

FIG. 8 is a flow diagram of an example method 800 for locking a phase locked loop (PLL), according to some embodiments. In some embodiments, a frequency command word (FCW) is set and a phase locked loop (PLL) is turned on at 802. In some embodiments, frequency settling occurs at 804. In some embodiments, frequency settling is repeated via 806A until a phase error (PHE) is less than a DCO period. Continuing at 806B to 808, phase settling is enabled when a multi-phase TDC is enabled. At 810, the first phase finder it turned on, and operates continuously 812A until the PHE is less than at least about ninety degrees at 812. When the PHE is less than ninety degrees, the method continues at 812B. At 814, the first phase finder is turned off, and the second phase finder is turned on at 816. In some embodiments, the second phase finder operates until a threshold is met at 818. At 820, the PLL is locked.

Figure 9:
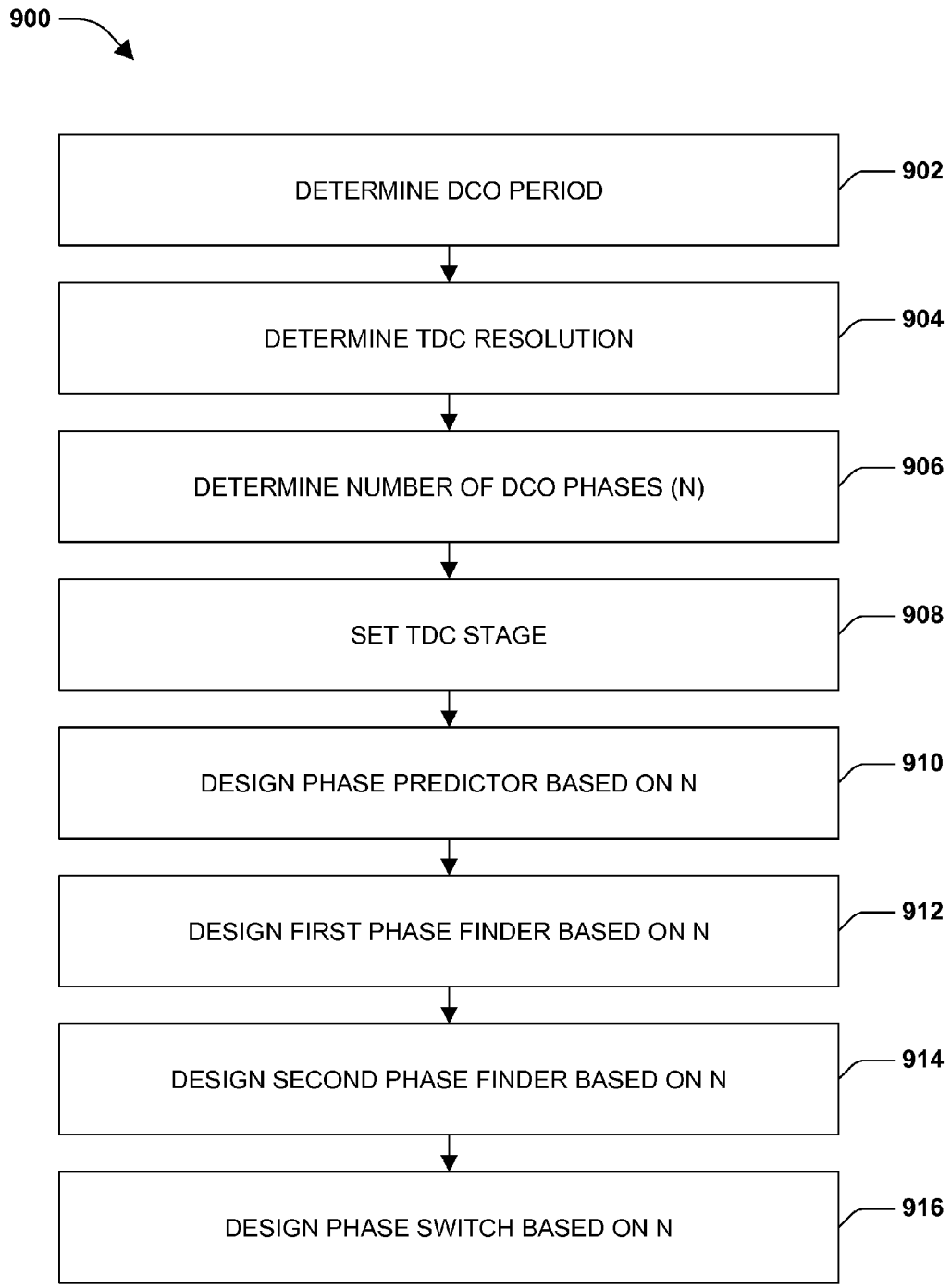
FIG. 9 is a flow diagram of an example method for designing a phase locked loop (PLL), according to some embodiments.

FIG. 9 is a flow diagram of an example method 900 for designing a phase locked loop (PLL), according to some embodiments. In some embodiments, a DCO period is determined at 902. In some embodiments, a TDC resolution is determined at 904. For example, an inverter delay time is selected at 904. In some embodiments, a number of DCO phases associated with a multi-phase CKV is determined at 906. For example, a multi-phase CKV is four phases, eight phases, etc. In some embodiments, TDC is set at 908. In some embodiments, at least one of a phase predictor, first phase finder, second phase finder, or a phase switch is designed based on the number of phases at 910, 912, 914, and 916.

According to some aspects, a multi-phase time-to-digital converter (TDC) for a phase locked loop (PLL) is provided, comprising a first phase finder, a phase predictor, a second phase finder, and a phase switch. In some embodiments, the first phase finder is configured to generate a first fractional phase signal of a multi-phase variable clock (CKV) signal based on at least one of the multi-phase CKV signal or a reference frequency (FREF) signal. In some embodiments, the multi-phase CKV signal is associated with one or more clock signals and one or more corresponding phases. In some embodiments, phase predictor is configured to generate a phase select (QSEL) signal associated with a fractional frequency command word (FCW) signal based on at least one of a FCW signal or a phase reference (PHR) signal. In some embodiments, phase predictor is configured to generate a multi-phase CKV select (CKVSEL) signal corresponding to a clock signal of the one or more clock signals and a phase of the one or more corresponding phases based on at least one of the multi-phase CKV signal or the QSEL signal. In some embodiments, the second phase finder is configured to generate a second fractional phase signal of the multi-phase CKV signal based on at least one of the CKVSEL signal or the QSEL signal. In some embodiments, the phase switch is configured to select at least one of the first fractional phase signal or the second fractional phase signal based on a phase error (PHE) signal.

According to some aspects, a phase locked loop (PLL) is provided, comprising an accumulator component. In some embodiments, the PLL comprises an adder component connected to the accumulator component. In some embodiments, the PLL comprises a loop filter connected to the adder component. In some embodiments, the PLL comprises a digitally controlled oscillator (DCO) connected to the loop filter. In some embodiments, the PLL comprises a sigma delta modulation component connected to at least one of the DCO or the loop filter. In some embodiments, the PLL comprises a counter component connected to at least one of the DCO or the adder component. In some embodiments, the PLL comprises a multi-phase time-to-digital converter (TDC). In some embodiments, the multi-phase TDC comprises a first phase finder connected to the DCO. In some embodiments, the multi-phase TDC comprises a phase predictor connected to the DCO. In some embodiments, the multi-phase TDC comprises a second phase finder connected to the phase predictor. In some embodiments, the multi-phase TDC comprises a phase switch connected to at least one of the first phase finder, the second phase finder, or the adder component.

According to some aspects, a method for locking a phase locked loop (PLL) is provided, comprising generating a first fractional phase signal of a multi-phase variable clock (CKV) signal based on at least one of the multi-phase CKV signal or a reference frequency (FREF) signal, the multi-phase CKV signal associated with one or more clock signals and one or more corresponding phases. In some embodiments, the method comprises generating a second fractional phase signal of the multi-phase CKV signal based on at least one of the multi-phase CKV signal, a frequency command word (FCW) signal, or a phase reference (PHR) signal. In some embodiments, the method comprises selecting at least one of the first fractional phase signal or the second fractional phase signal based on a phase error (PHE) signal.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A multi-phase time-to-digital converter (TDC) for a phase locked loop (PLL), comprising:
   a phase predictor configured to generate a multi-phase variable clock select (CKVSEL) signal based on at least one of a multi-phase variable clock (CKV) signal or a phase select (QSEL) signal;
   a phase finder configured to generate a fractional phase signal of the multi-phase CKV signal based on at least one of the CKVSEL signal or the QSEL signal; and
   a phase switch configured to generate a fractional variable phase correction (PHVF) signal based on the fractional phase signal when a phase error (PHE) signal applied to the phase switch is greater than a first threshold.

2. The multi-phase TDC of claim 1, comprising:
   a second phase finder configured to generate a second fractional phase signal of the multi-phase CKV signal based on at least one of the multi-phase CKV signal or a reference frequency (FREF) signal.

3. The multi-phase TDC of claim 2, the phase switch configured to generate the PHVF signal based on the second fractional phase signal when the PHE signal is less than or equal to the first threshold.

4. The multi-phase TDC of claim 1, the first threshold a function of a number of phases associated with the multi-phase CKV signal.

5. The multi-phase TDC of claim 1, the phase predictor configured to generate the QSEL signal based on at least one of a frequency command word (FCW) signal or a phase reference (PHR) signal.

6. The multi-phase TDC of claim 1, the multi-phase CKV signal associated with a first clock signal having a first phase and a second clock signal having a second phase.

7. The multi-phase TDC of claim 6, the phase predictor configured to select, from the multi-phase CKV signal, the first clock signal to generate the multi-phase CKVSEL signal.

8. The multi-phase TDC of claim 1, the multi-phase CKV signal corresponding to a 4-phase CKV signal.

9. The multi-phase TDC of claim 1, the first threshold corresponding to 90 degrees.

10. A phase locked loop (PLL), comprising:
    a multi-phase time-to-digital converter (TDC), comprising:
      a first phase finder connected to a digitally controlled oscillator (DCO);
      a phase predictor connected to the DCO;

a second phase finder connected to the phase predictor; and a phase switch connected to at least one of the first phase finder or the second phase finder.

11. The PLL of claim 10, the phase switch connected to the first phase finder and the second phase finder.

12. The PLL of claim 10, the phase switch configured to:
generate a fractional variable phase correction (PHVF) signal based on a first fractional phase signal generated by the first phase finder when a phase error (PHE) signal is less than or equal to a first threshold, and generate the PHVF signal based on a second fractional phase signal generated by the second phase finder when the PHE signal is greater than the first threshold.

13. The PLL of claim 10, the DCO configured to generate a multi-phase variable clock (CKV) signal associated with a first clock signal having a first phase and a second clock signal having a second phase.

14. The PLL of claim 10, the phase switch configured to disable the second phase finder when the first phase finder is enabled.

15. The PLL of claim 10, the phase switch configured to enable the second phase finder when the first phase finder is disabled.

16. A method for locking a phase locked loop (PLL), comprising:

generating a first fractional phase signal of a multi-phase variable clock (CKV) signal based on the multi-phase CKV signal and a reference frequency (FREF) signal, the multi-phase CKV signal associated with a first clock signal having a first phase and a second clock signal having a second phase.

17. The method of claim 16, comprising:
generating a second fractional phase signal of the multi-phase CKV signal based on a phase select (QSEL) signal.

18. The method of claim 17, comprising:
generating a fractional variable phase correction (PHVF) signal based on at least one of the first fractional phase signal or the second fractional phase signal.

19. The method of claim 17, comprising:
generating the QSEL signal based upon a phase reference (PHR) signal and a frequency command word (FCW) signal.

20. The method of claim 17, comprising:
generating a fractional variable phase correction (PHVF) signal based on the first fractional phase signal when a phase error (PHE) signal is less than or equal to a first threshold; and generating the PHVF signal based on the second fractional phase signal when the PHE signal is greater than the first threshold.

\* \* \* \* \*